United States Patent Office 3,306,857

Patented Feb. 28, 1967

3,306,857

SOLID SOLUTION OF $W_{1-x}V_xSe_2$ AND THERMOELECTRIC ELEMENT CONSISTING OF SAME

Lothar H. Brixner, Brandywine Hills, Pa., assignor to E. I. du Pont de Nemours and Company, Wilmington, Del., a corporation of Delaware No Drawing. Filed Mar. 28, 1962, Ser. No. 183,057

The portion of the term of the patent subsequent to July 27, 1982, has been disclaimed 2 Claims. (Cl. 252—62.3)

This invention relates to compositions having thermoelectric properties, to thermoelectric generators made from the compositions, and to processes for producing the compositions. More particularly, the invention is directed to a thermoelectric solid-solution, vanadium selenide-tungsten selenide, having the empirical formula $W_{1-x}V_xSe_2$, wherein $x$ may vary from 0.01 to 0.05, to a thermoelectric generator having as an essential component thereof a thermoelectric element consisting of said selenide, the element being characterized by low resistivity, low thermal conductivity, and high Seebeck coefficient, and to the steps in a process for the production of said selenide, comprising mixing to substantial uniformity powders of tungsten, vanadium, and selenium in the appropriate atomic proportions and heating the mixture under vacuum to a temperature above the reaction temperature.

The thermoelectric material of this invention may be considered as a tungsten selenide which has been modified by the introduction of vanadium into the tungsten selenide crystal lattice. Specifically, it has been found that the substitution of one to five atoms of vanadium for the same number of tungsten atoms per 100 atoms of metal results in a crystal diselenide which exhibits outstanding thermoelectric properties.

The art is already familiar with various thermoelectric materials and the manner of using them for converting heat energy to electrical energy. An important characteristic of such materials is the "Seebeck coefficient." This is calculated from measured voltage at a known temperature differential by the formula:

$$S=\frac{EMF}{\Delta T}\times 1000$$

The novel thermoelectric material of this invention has a Seebeck coefficient at 600° C. which is considered very good, viz., 188$\mu$ volts deg.$^{-1}$.

Low resistivity and low thermal conductivity, in addition to high Seebeck coefficient, are necessary for a good thermoelectric material. An expression which takes all three of these factors into account is the "figure of merit." This is calculated as follows:

$$Z \text{ (figure of merit in } ^\circ\text{C.}^{-1}) = \frac{S^2}{rk}$$

where $r$ is resistivity in ohm centimeters, $k$ is the thermal conductivity in watts per centimeter degree, and S is the Seebeck coefficient in bolts per ° C. The thermoelectric material of this invention has a figure of merit of 600° C. which is of the order of $3.2\times10^{-4}$, deg.$^{-1}$, indicative of good over-all thermoelectric properties.

To make the novel thermoelectric composition one first mixes to substantial uniformity powders of tungsten, vanadium, and selenium in the proper atomic proportions and then heats the mixture under vacuum to a temperature above the reaction temperature. The powdered elements used preferably are of the highest purity available. Good mixing of the reactant powders prior to heating is essential in order to obtain uniformity of the product. It is desirable that the powder particles be of approximately the same size. Powders which are −200 mesh (U.S. standard) give very good results, but particles size is not particularly critical provided the necessary mixing is achieved as above specified.

The thermoelectric composition is useful in the generation of electricity directly from thermal energy without reliance upon mechanical parts. Thermoelectric generators are well known in the art, and thermoelectric elements of a size and shape to fit any particular generator can be prepared from the composition of this invention by compacting the powdered product into the desired shape and size, followed by sintering—that is, by powder metallurgical techniques generally. See, for example, "Thermoelectricity," P. H. Egli, Ed., John Wiley & Sons, New York, 1960.

The invention will be better understood by reference to the following illustrative example.

*Example*

Into a quartz ampoule 15 mm. by 200 mm. was charged 9.0 grams of tungsten powder, 0.077 gram of vanadium powder, and 7.9667 grams of selenium powder, these amounts being proportionate for the composition $W_{0.97}V_{0.03}Se_2$. The ampoule was evacuated and sealed off by fusion. The sealed ampoule and its contents were then placed in a furnace and heated at a rate of 100° C. per hour to 700° C. where the temperature was held for ten hours. At the end of this period a dark, free-flowing powder reaction product was obtained. After cooling this product was remixed by shaking the ampoule vigorously, but without opening it. The ampoule was then replaced in the furnace and reheated to about 1100° C., which temperature was maintained for ten hours.

At the end of this period a highly crystalline, free-flowing, metallic-looking, powder reaction product was obtained. This powder was removed from the ampoule and pressed into a bar ¼" x ¼" x 2" under a pressure of 40 to 50 t.s.i. The electrical properties of the bar were measured in the direction of the long dimension. The properties found for the pressed bar were as follows:

| Resistivity, milliohm, cm. | | Seebeck Coefficient, $\mu$V deg.$^{-1}$ | | Thermal Conductivity, watts/cm. deg. | | Figure of Merit, deg.$^{-1}$ | |
|---|---|---|---|---|---|---|---|
| 25° C. | 600° C. | 25° C. | 600° C. | 25° C. | 600° C. | 25° C. | 600° C. |
| 3.7 | 5.55 | 74 | 188 | 0.07 | 0.02 | $2.1\times10^{-5}$ | $3.2\times10^{-4}$ |

The crystal structure was determined by X-ray analysis. The material was single phase crystallizing in the $D_{6h}^4$ structure of $WSe_2$. Lattice parameters were found to be $a_0=3.288\mp-0.001$ A. and $c_0=12.948\mp0.002$ A. These measurements show it to be isomorphic with $WSe_2$ whose lattice parameters were determined to be $a_0=3.280$ A., and $c_0=12.950$ A.

I claim:

1. A solid solution of vanadium selenide and tungsten selenide having the empirical formula $W_{1-x}V_xSe_2$, where $x$ may be any number between 0.01 and 0.05.

2. A thermoelectric element of a thermoelectric generator, said element characterized by low resistivity, low thermal conductivity, and high Seebeck coefficient, and consisting of a solid-solution, vanadium-modified tungsten selenide having a empirical formula $W_{1-x}V_xSe_2$, where $x$ may be any number between 0.01 and 0.05.

References Cited by the Examiner

UNITED STATES PATENTS

| | | | |
|---|---|---|---|
| 2,406,172 | 8/1946 | Smithells | 136—5 |

OTHER REFERENCES

Glemser et al.: Zeitschrift fur Anorganische Chemie, 257, pages 241–6 (1948).

WINSTON A. DOUGLAS, *Primary Examiner.*

JOHN H. MACK, *Examiner.*

D. L. WALTON, *Assistant Examiner.*